US012597888B2

(12) United States Patent
Mehr

(10) Patent No.:  US 12,597,888 B2
(45) Date of Patent:  Apr. 7, 2026

(54) ADAPTIVE STABILIZATION AND/OR PERFORMANCE OPTIMIZATION OF POWER AMPLIFIERS

(71) Applicant: GlobalFoundries U.S. Inc., Malta, NY (US)

(72) Inventor: Payam Liam Mehr, Irvine, CA (US)

(73) Assignee: GlobalFoundries U.S. Inc., Malta, NY (US)

( * ) Notice:  Subject to any disclaimer, the term of this patent is extended or adjusted under 35 U.S.C. 154(b) by 443 days.

(21) Appl. No.: 18/306,541

(22) Filed:  Apr. 25, 2023

(65) Prior Publication Data

US 2024/0364273 A1      Oct. 31, 2024

(51) Int. Cl.
     *H03F 3/45*       (2006.01)
     *H03F 1/30*       (2006.01)
     *H03F 3/24*       (2006.01)
(52) U.S. Cl.
     CPC .............. *H03F 1/301* (2013.01); *H03F 3/245* (2013.01); *H03F 2200/451* (2013.01)
(58) Field of Classification Search
     CPC ..................................... H03F 3/45; H03F 1/22
     USPC ................................................ 330/253, 311
     See application file for complete search history.

(56) References Cited

U.S. PATENT DOCUMENTS

| | | | |
|---|---|---|---|
| 7,248,120 B2 | 7/2007 | Burgener et al. | |
| 7,414,481 B2 * | 8/2008 | Li ........................ | H03B 5/1215 330/253 |

| | | | |
|---|---|---|---|
| 8,816,769 B2 * | 8/2014 | Moreira .............. | H03F 3/45188 330/253 |
| 9,543,910 B2 | 1/2017 | Adabi et al. | |
| 9,876,501 B2 | 1/2018 | Chen et al. | |
| 9,935,583 B2 | 4/2018 | Abe et al. | |
| 9,973,145 B2 | 5/2018 | Nobbe et al. | |
| 10,848,111 B2 | 11/2020 | Arayashiki et al. | |
| 2002/0030543 A1 | 3/2002 | French et al. | |
| 2002/0044018 A1 | 4/2002 | Dupuis et al. | |

(Continued)

FOREIGN PATENT DOCUMENTS

TW          M549490 U      9/2017

OTHER PUBLICATIONS

U.S. Appl. No. 17/545,057, Amendment to Final Office Action filed Sep. 30, 2024, 16 pages.

(Continued)

*Primary Examiner* — Henry Choe
(74) *Attorney, Agent, or Firm* — David Cain; Hoffman Warnick LLC

(57)          ABSTRACT

Disclosed are embodiments of an amplifier circuit (e.g., a differential amplifier circuit with symmetric parallel branches between input and output stages or a single-ended amplifier circuit with one leg between input and output stages). The circuit includes a power stage. Within the power stage of a differential amplifier circuit, the parallel branches include one or more pairs of power transistors, and varactors are connected to gates of at least one pair of power transistors. Within the power stage of a single-ended amplifier circuit there are one or more power transistors, and a varactor is connected to a gate of at least one power transistor. In operation, capacitance of each varactor is adjustable to fine-tune power transistor gate capacitance and thereby achieve stability and/or improve performance of the amplifier circuit.

20 Claims, 13 Drawing Sheets

(56) References Cited

U.S. PATENT DOCUMENTS

| 2011/0227648 A1 | 9/2011 | Mohammadi et al. |
| 2013/0281043 A1 | 10/2013 | Mu |
| 2015/0311873 A1 | 10/2015 | Wang et al. |
| 2019/0006996 A1 | 1/2019 | Mao |
| 2023/0179162 A1 | 6/2023 | Mehr et al. |

OTHER PUBLICATIONS

U.S. Appl. No. 17/545,057, Office Action dated May 23, 2024, 26 pages.
U.S. Appl. No. 17/545,057, Response to Office Action filed Jun. 12, 2024, 15 pages.
Alluri et al., "A Ka Band Power Amplifier with Varactor-Based Analog Predistortion in pMOS-SOI," 2022 IEEE Topical Conference on RF/Microwave Power Amplifiers for Radio and Wireless Applications (PAWR), pp. 42-45.
Anonymous et al., "IEEE Standard Letter Designations for Radar-Frequency Bands," IEEE SA Standards Association, IEEE Areospace and Electronic Systems Society, approved Nov. 7, 2019, 15 pages.
Choi et al., "K-Band Hetero-Stacked Differential Cascode Power Amplifier with High Psat and Efficiency in 65 nm LP CMOS Technology," Electronics 2021, Published Apr. 8, 2021, 9 pages.
Dabag et al., "Analysis and Design of Stacked-FET Millimeter-Wave Power Amplifiers," IEEE Transactions on Microwave Theory and Techniques, vol. 61, No. 4, Apr. 2013, pp. 1543-1556.
Daneshgar et al., "High-Power Generation for mm-Wave 5G Power Amplifiers in Deep Submicrometer Planar and FinFET Bulk CMOS," IEEE Transactions on Microwave Theory and Techniques, vol. 68, No. 6, Jun. 2020, pp. 2041-2056.
Entesari et al., "CMOS Distributed Amplifiers With Extended Flat Bandwidth and Improved Input Matching Using Gate Line With Coupled Inductors," IEEE Transactions on Microwave Theory and Techniques, vol. 57, No. 12, Dec. 2009, pp. 2862-2871.
Fathi et al., "A Stacked 6.5-GHz 29.6-dBm Power Amplifier in Standard 65-nm CMOS," IEEE 2010, 4 pages.
Feng et al., "A 21.5-26.4 GHz CMOS Cascode Driver Amplifier with 13.9 dBm Output Power for 24G Fmcw Radar Applications," IEEE 2018, 3 pages.
Heydari, Design and Analysis of a Performance-Optimized CMOS UWB Distributed Lna, IEEE Journal of Solid-State Circuits, vol. 42, No. 9, Sep. 2007, pp. 1892-1905.
Minami et al., "A 60 GHz CMOS Power Amplifier Using Varactor Cross-Coupling Neutralization with Adaptive Bias," Proceedings of the Asia-Pacific Microwave Conference 2011, pp. 789-792.
Neo et al., "Adaptive Multi-Band Multi-Mode Power Amplifier Using Integrated Varactor-Based Tunable Matching Networks," IEEE Journal of Solid-State Circuits, vol. 41, No. 9, Sep. 2006, pp. 2166-2176.
Oßmann et al., "A Circuit Technique to Compensate PVT Variations in a 28 nm CMOS Cascode Power Amplifier," GeMiC 2015, Mar. 16-18, 2015, Nurnberg Germany, pp. 131-134.
Qiao et al., "An Intelligently Controlled RF Power Amplifier With a Reconfigurable MEMS-Varactor Tuner," IEEE Transactions on Microwave Theory and Techniques, vol. 53, No. 3, Mar. 2005, pp. 1089-1095.
Wang et al., "A Compact Low-Noise Weighted Distributed Amplifier in CMOS," ISSCC 2009, Session 12, RF Building Blocks, 12.3, 3 pages.
Yang et al., "Ka-Band Three-Stack CMOS Power Amplifier with Split Layout of External Gate Capacitor for 5G Applications," Electronics, Published Jan. 13, 2023, 12, 432, 13 pages.
U.S. Appl. No. 17/545,057, Office Action dated Nov. 7, 2024, 16 pages.
U.S. Appl. No. 17/545,057, Final Office Action dated Aug. 29, 2024, 14 pages.

* cited by examiner

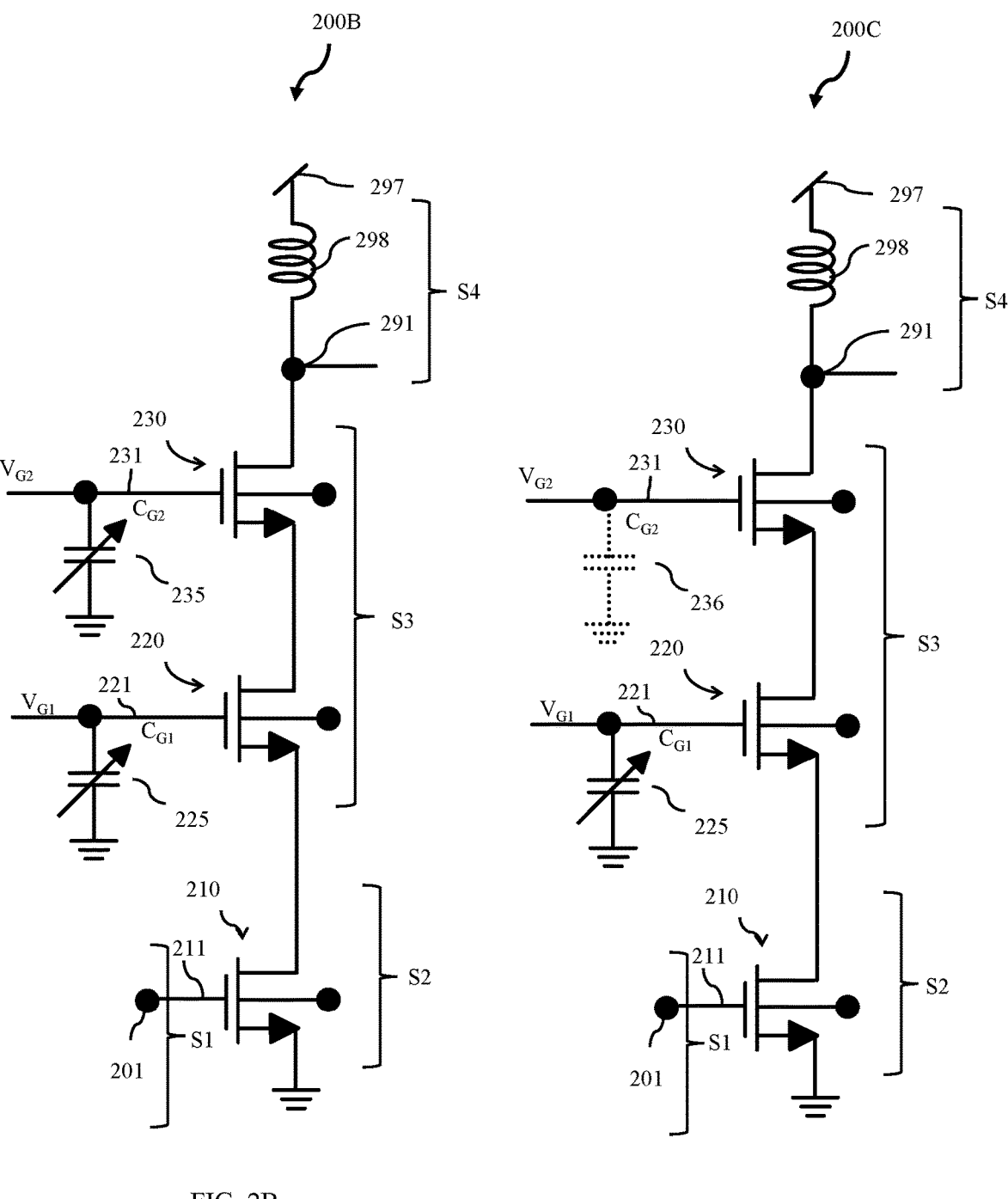
FIG. 2B                                              FIG. 2C 120a, 120b, 130a, 130b, 220 or 230

300

(125a, 125b, 135a, 135b, 225 or 235)

Optimal I$_{DC}$ and Base Level C$_{G1}$
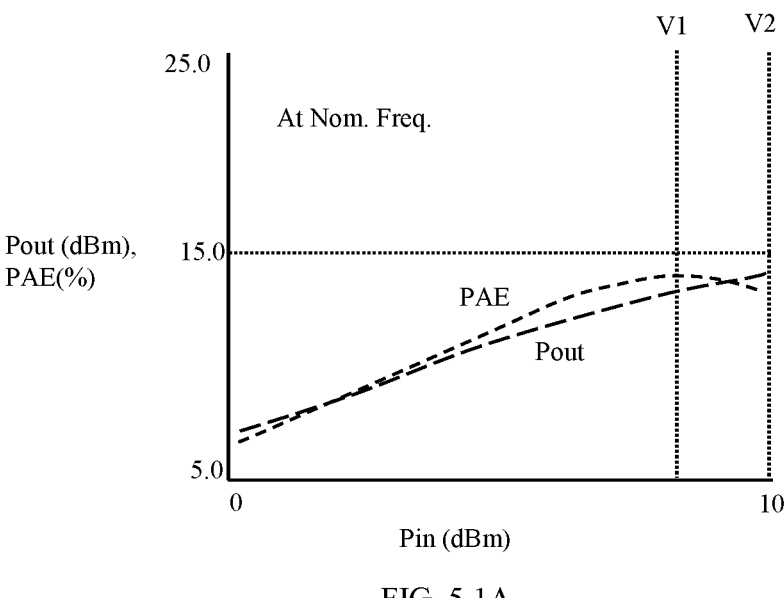
FIG. 5.1A
Optimal I$_{DC}$ and Base Level C$_{G1}$
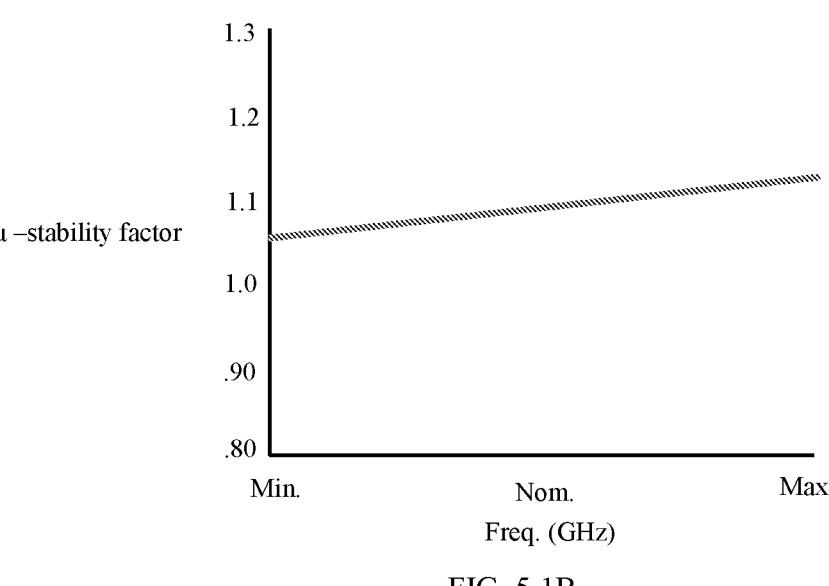
FIG. 5.1B

Adjusted I$_{DC}$ (e.g., optimal I$_{DC}$ + ~12mA) and Base Level C$_{G1}$
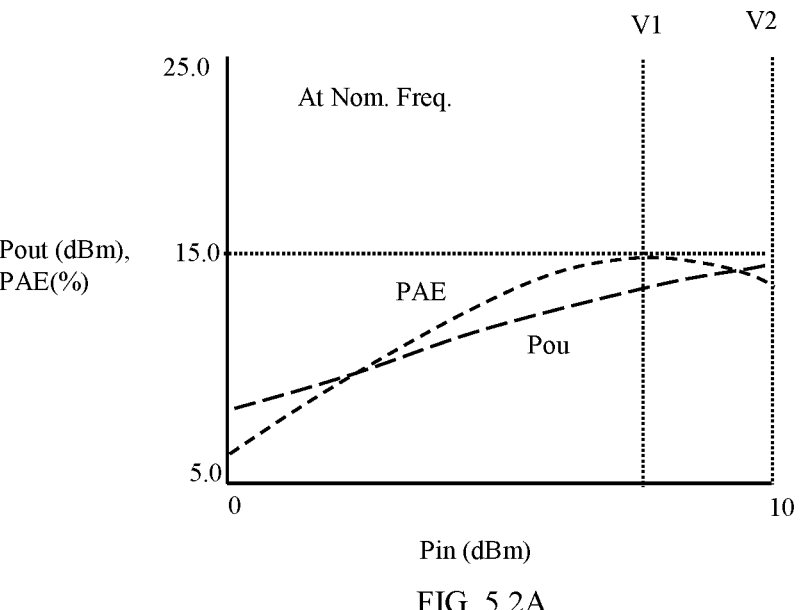
FIG. 5.2A
Adjusted I$_{DC}$ (e.g., optimal I$_{DC}$ + ~12mA) and Base Level C$_{G1}$
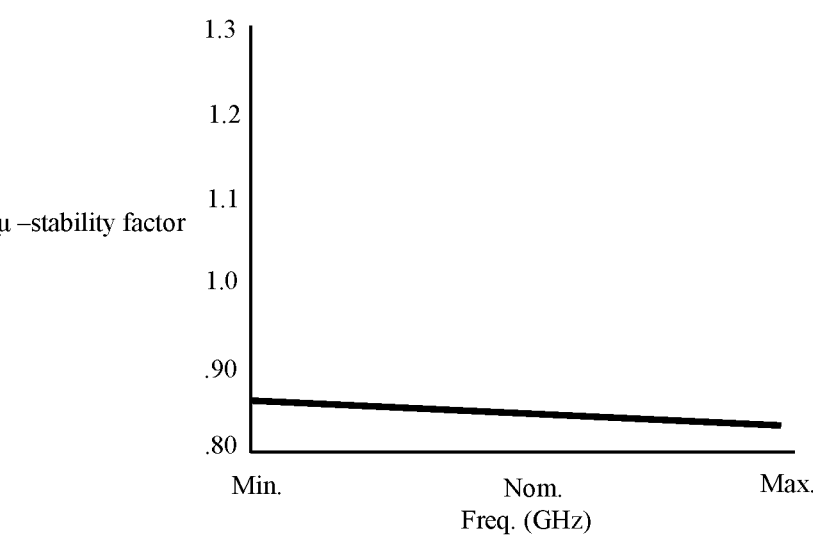
FIG. 5.2B Adjusted $I_{DC}$ (e.g., Optimal $I_{DC}$ + ~12mA) and Adjusted $C_{G1}$ (e.g., Base Level $C_{G1}$ + ~13.5fF)
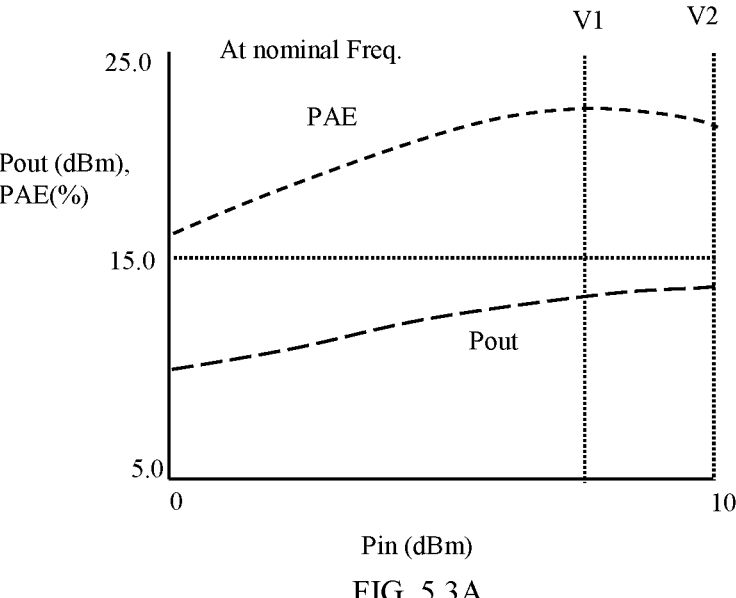
FIG. 5.3A
Adjusted $I_{DC}$ (e.g., Optimal $I_{DC}$ + ~12mA) and Adjusted $C_{G1}$ (e.g., Base Level $C_{G1}$ + ~13.5fF)
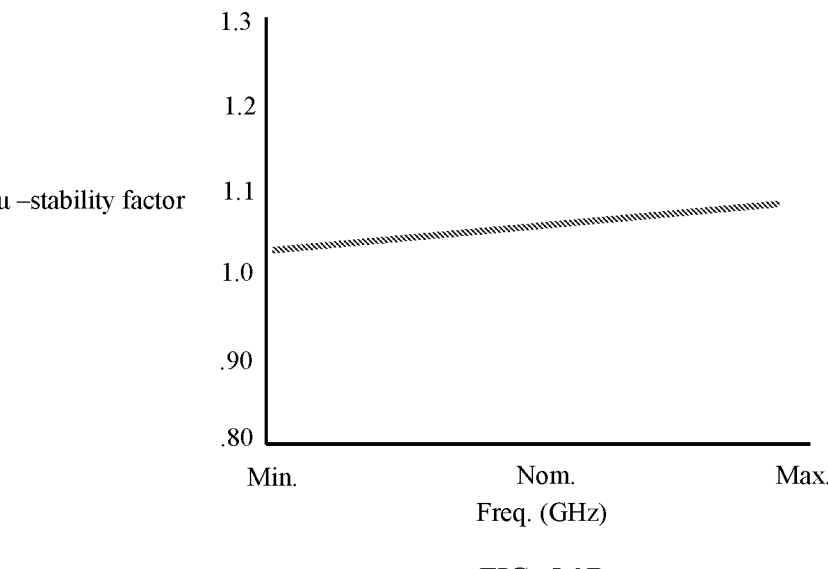
FIG. 5.3B

Low, Nom., High Operating Temperatures and Based Level $C_{G1}$
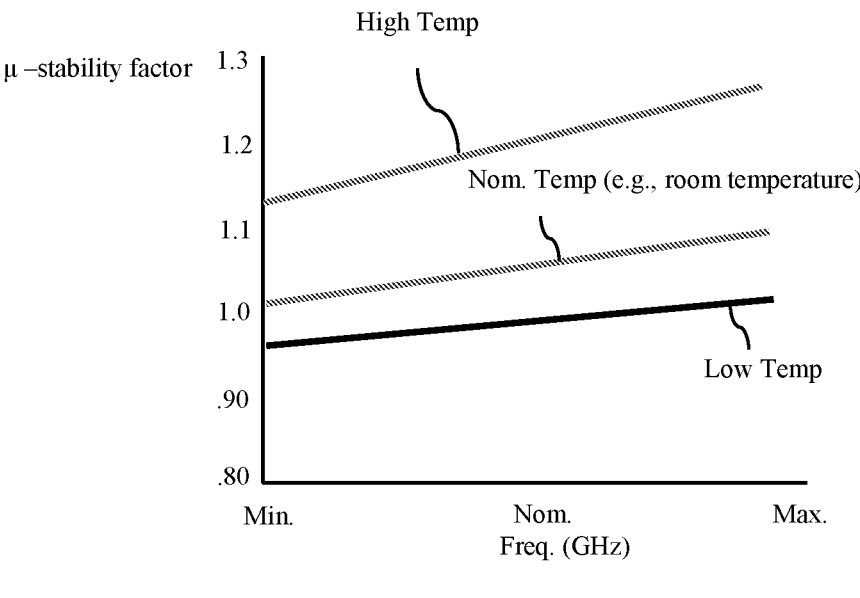
FIG. 6.1
Low, Nom., High Operating Temperatures and Adjusted $C_{G1}$ (e.g., Base Level $C_{G1}$ - ~4fF)
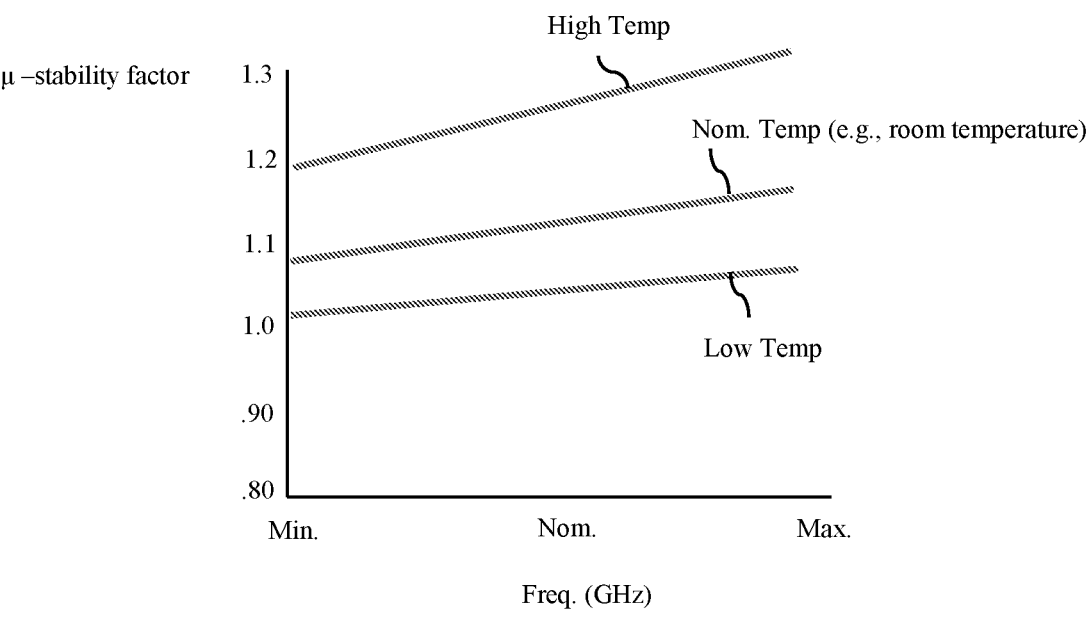
FIG. 6.2

Process Corners ss, tt, ff and Base Level C$_{G1}$
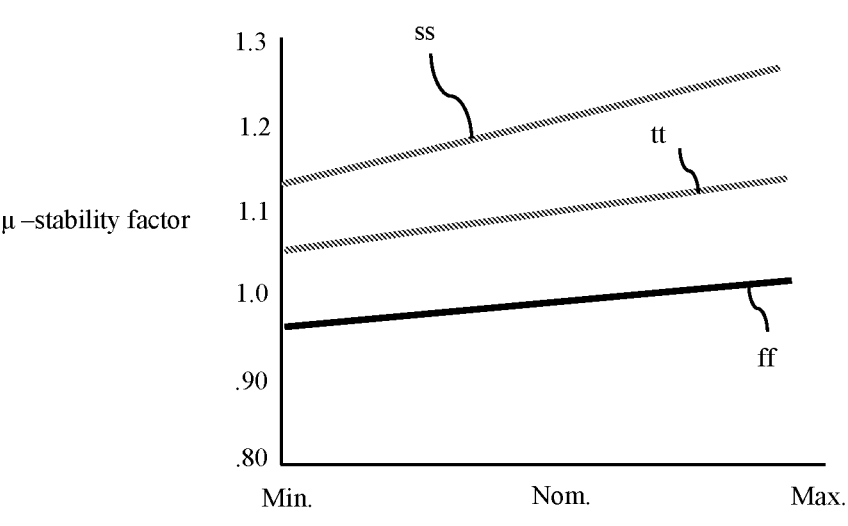
FIG. 7.1
Process Corners ss, tt, ff and Adjusted C$_{G1}$ (e.g., Base Level C$_{G1}$- ~24.5fF)
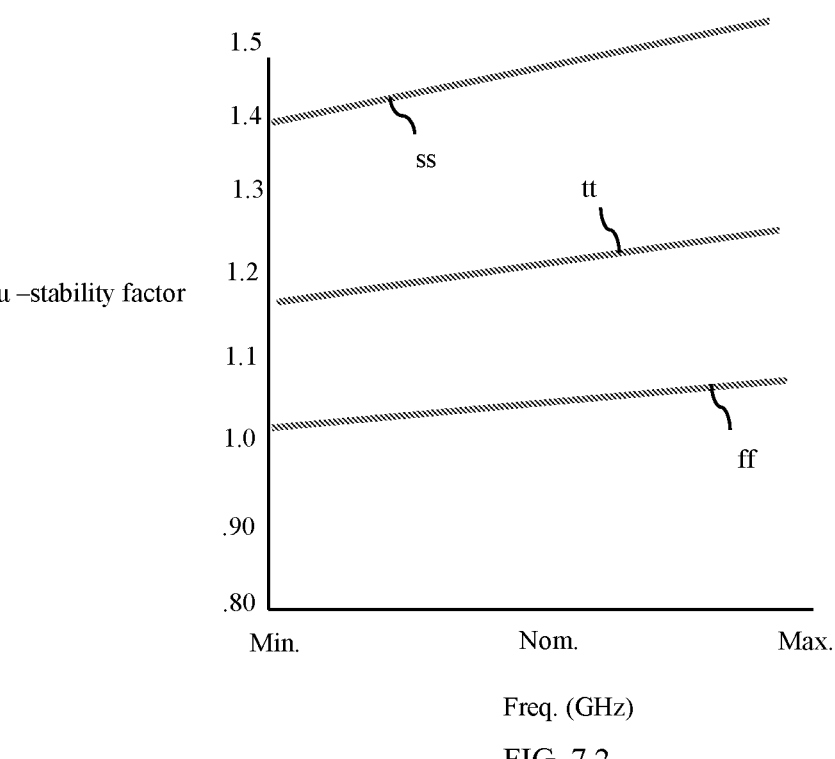
Freq. (GHz)
FIG. 7.2

Optimal I$_{DC}$ and Base Level C$_{G1}$
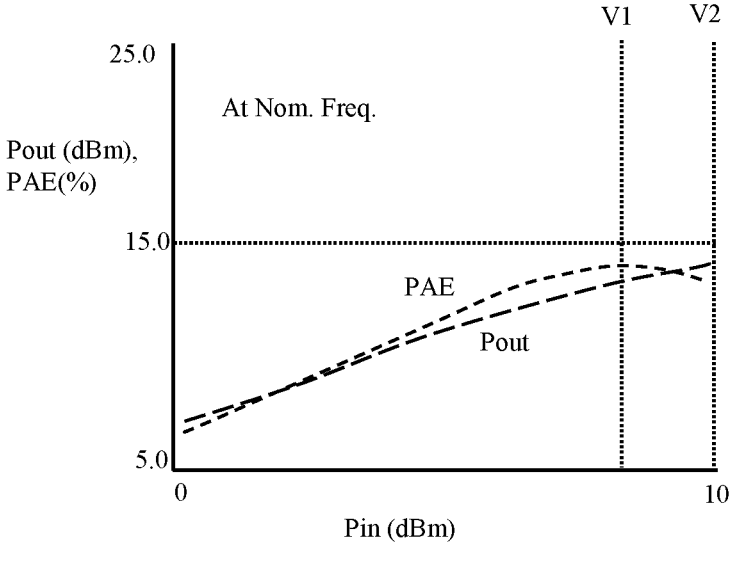
FIG. 8.1A
Optimal I$_{DC}$ and Base Level C$_{G1}$
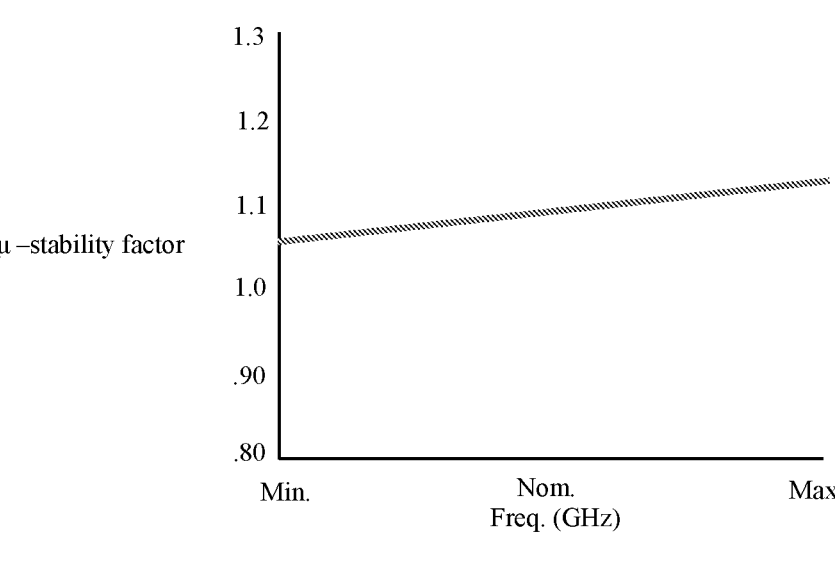
FIG. 8.1B

Optimal I$_{DC}$ and Adjusted C$_{G1}$ (e.g., Base Level C$_{G1}$ + ~4.9fF)
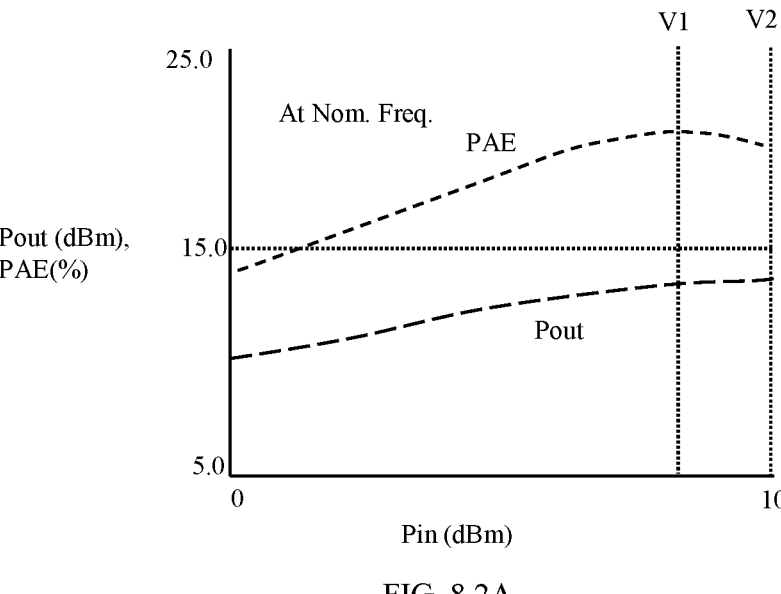
FIG. 8.2A
Optimal I$_{DC}$ and Adjusted C$_{G1}$ (e.g., Base Level C$_{G1}$ + ~4.9fF)
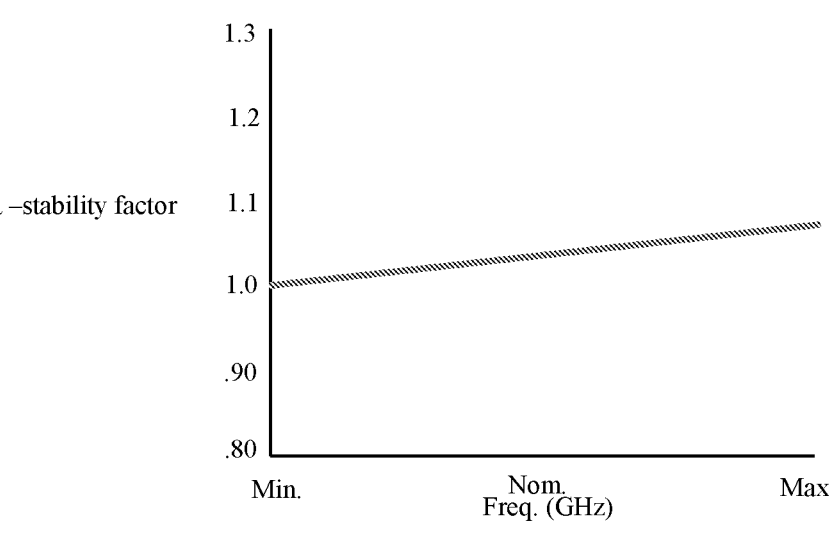
FIG. 8.2B

ADAPTIVE STABILIZATION AND/OR PERFORMANCE OPTIMIZATION OF POWER AMPLIFIERS

BACKGROUND

The present disclosure relates to amplifiers and, more particularly, to embodiments of an amplifier circuit (e.g., a power amplifier circuit) and a method of operating the amplifier circuit.

Considerations in modern integrated circuit design include, but are not limited to, performance improvement, size scaling, and power consumption. When designing amplifiers, stability is also a consideration. Oftentimes design changes to one aspect of design can yield an undesirable trade-off with respect to one or more of the aspects. For example, the stability of an amplifier generally refers to its immunity to causing spurious oscillations. Various stability metrics are known in the art for characterizing amplifier stability including, but not limited to, the k-stability factor method that ensures unconditional stability and the $\mu$-stability factor method that ensures unconditional stability and further provides a relative measure of stability. Typically, amplifiers are designed to ensure stability (e.g., as indicated by the k-stability factor or $\mu$-stability factor) given a predetermined set of process, voltage, temperature (PVT) conditions and for a given operating band. However, design changes to improve stability given a set of PVT conditions may be at the expense of performance. Additionally, operation of the amplifier outside this set of PVT conditions may still result in instability and/or instability outside the operating band may negatively affect performance (e.g., cause a decrease in gain) inside the operating band.

SUMMARY

Disclosed herein are embodiments of an amplifier circuit. Some embodiments of the amplifier circuit can include an input stage and an output stage. The amplifier circuit can further include two parallel branches connected between the input stage and the output stage. Each of these two branches can include a drive transistor and a power transistor connected in series to the output stage. The gate of the drive transistor can further be connected to the input stage. Each branch can further include a varactor connected to the gate of the power transistor.

Other embodiments of the amplifier circuit can similarly include an input stage, an output stage and two parallel branches connected between the input stage and the output stage. However, in these embodiments, each branch can include multiple series-connected power transistors. For example, each branch can include a drive transistor, a first power transistor, and a second power transistor connected in series to the output stage. The gate of the drive transistor can be connected to the input stage. Each branch can further a first varactor connected to the gate of the first power transistor and a second varactor connected to the gate of the second power transistor.

Still other embodiments of the amplifier circuit can similarly include an input stage and an output stage, but instead of parallel branches between the input stage and the output stage, these embodiments can include a single leg between the input stage and the output stage. For example, a single drive transistor and at least one power transistor can be connected in series to the output stage and the gate of the drive transistor can be connected to the input stage. The amplifier circuit can further include a varactor connected to the gate of the power transistor.

BRIEF DESCRIPTION OF THE DRAWINGS

The present disclosure will be better understood from the following detailed description with reference to the drawings, which are not necessarily drawn to scale and in which:

FIGS. 2A, 2B, and 2C are schematic diagrams illustrating alternative embodiments of a single-ended amplifier circuit;

FIGS. 5.1A-5.1B are graphs illustrating performance and stability factor, respectively, of an amplifier circuit operating with an optimal biasing condition and a base level gate capacitance;

FIGS. 5.2A-5.2B are graphs illustrating performance and stability factor, respectively, of an amplifier circuit operating with an adjusted biasing condition and base level gate capacitance;

FIGS. 5.3A-5.3B are graphs illustrating performance and stability factor, respectively, of an amplifier circuit operating with an adjusted biasing condition and an adjusted gate capacitance;

FIG. 6.1 is a graph illustrating stability factors of an amplifier circuit operating at different temperatures and with a base level gate capacitance;

FIG. 6.2 is a graph illustrating stability factors of an amplifier circuit operating at different temperatures and with an adjusted gate capacitance;

FIG. 7.1 is a graph illustrating stability factors of an amplifier circuit operating at different process corners and with a base level gate capacitance;

FIG. 7.2 is a graph illustrating stability factors of an amplifier circuit operating at different process corners and with an adjusted gate capacitance;

FIGS. 8.1A-8.1B are graphs illustrating performance and stability factor, respectively, of an amplifier circuit operating with an optimal biasing condition and a base level gate capacitance; and FIGS. 8.2A-8.2B are graphs illustrating improved performance and stability factor, respectively, of an amplifier circuit operating with an optimal biasing condition and an adjusted gate capacitance.

DETAILED DESCRIPTION

Figure 1A:
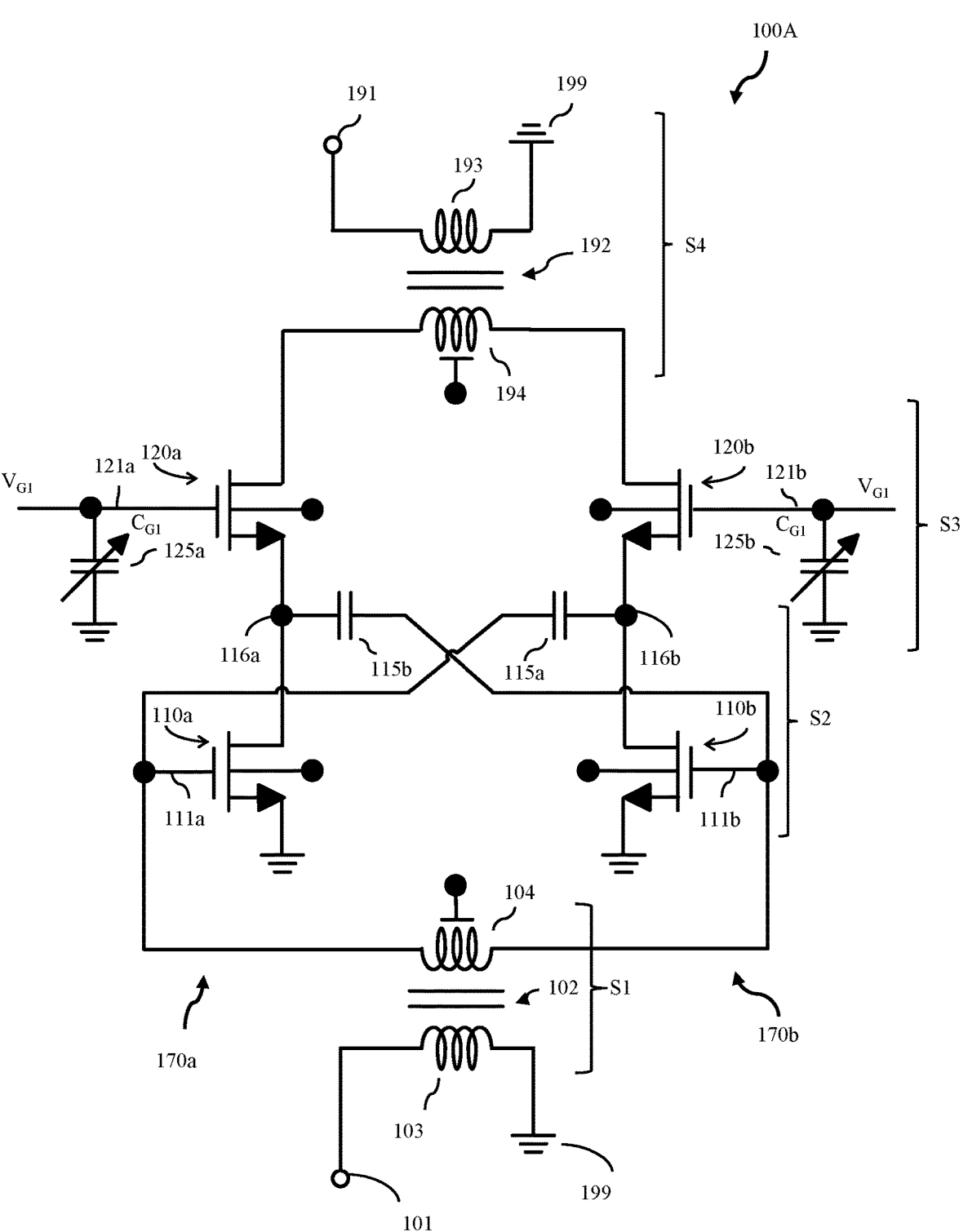
FIGS. 1A, 1B and 1C are schematic diagrams illustrating alternative embodiments of a differential amplifier circuit.

As mentioned above, amplifiers are typically designed to ensure stability (e.g., as indicated by the k-stability factor or $\mu$-stability factor mentioned above) given a predetermined set of process, voltage, temperature (PVT) conditions and for a given operating band. The set of PVT conditions can include, for example, a typical-typical (tt) process corner, an optimal DC bias current ($I_{DC}$) or bias current range, an optimal operating temperature or operating temperature range, etc. However, operation of the amplifier outside this set of PVT conditions (e.g., at slow-slow (ss) or fast-fast (ff) process corners, with a biasing condition above or below the optimal biasing condition, or at an operating temperature above or below the nominal operating temperature) may result in instability which needs to be accounted for in the design process. Furthermore, instability outside the band can negatively affect performance (e.g., decrease gain) inside the operating band.

In view of the foregoing disclosed herein are embodiments of an amplifier circuit (e.g., a power amplifier circuit). The amplifier circuit can be a differential amplifier circuit with symmetric parallel branches between input and output stages or, alternatively, a single-ended amplifier circuit with a single leg between input and output stages. In either case, the amplifier circuit can include a power stage, amongst other stages. Within the power stage of a differential amplifier circuit, the parallel branches can include one or more pairs of power transistors and gates of the power transistors in at least one of the pairs can be electrically connected to corresponding varactors. Within the power stage of a single-ended amplifier circuit, the leg can include one or more power transistors and the gate of at least one power transistor can be electrically connected to a varactor. In operation, the capacitance of the varactor(s) can be adjusted (e.g., up or down) in order to fine-tune power transistor gate capacitance and thereby achieve stability and/or improve performance (e.g., increase the maximum output power (Pout) and/or improve power added efficiency (PAE)). For example, if amplifier circuit operation is outside some predetermined set of PVT conditions (e.g., at a ff process corner, at a temperature outside the normal operating temperature range, at an $I_{DC}$ outside the optimal $I_{DC}$ range, etc.) and, as a result, the amplifier circuit may be deemed to be unstable, the power transistor gate capacitance(s) can be fine-tuned via the varactor(s) to achieve desired inter-transistor impedance, gain and stability. Optionally, gate capacitance adjustment can also be performance-dependent. Alternatively, even if amplifier circuit operation is within the predetermined set of PVT conditions (e.g., at a tt process corner, within the normal temperature range, at an optimal $I_{DC}$, etc.) such that the amplifier circuit is deemed to be stable, gate capacitance (s) of the power transistor(s) can be fine-tuned via the varactor(s) to improve performance after manufacturing. It should be noted that in differential amplifier circuits with multiple pairs of power transistors, capacitances of varactors connected to power transistors of a given pair will be set at the same level, but capacitances of any varactors connected to power transistors in different pairs can be set at the same or different levels depending on the size of the transistors and required impedance levels. In single-ended amplifier circuits with multiple power transistors, capacitances of any varactors connected to different power transistors can be set at the same or different levels.

Figure 1B:
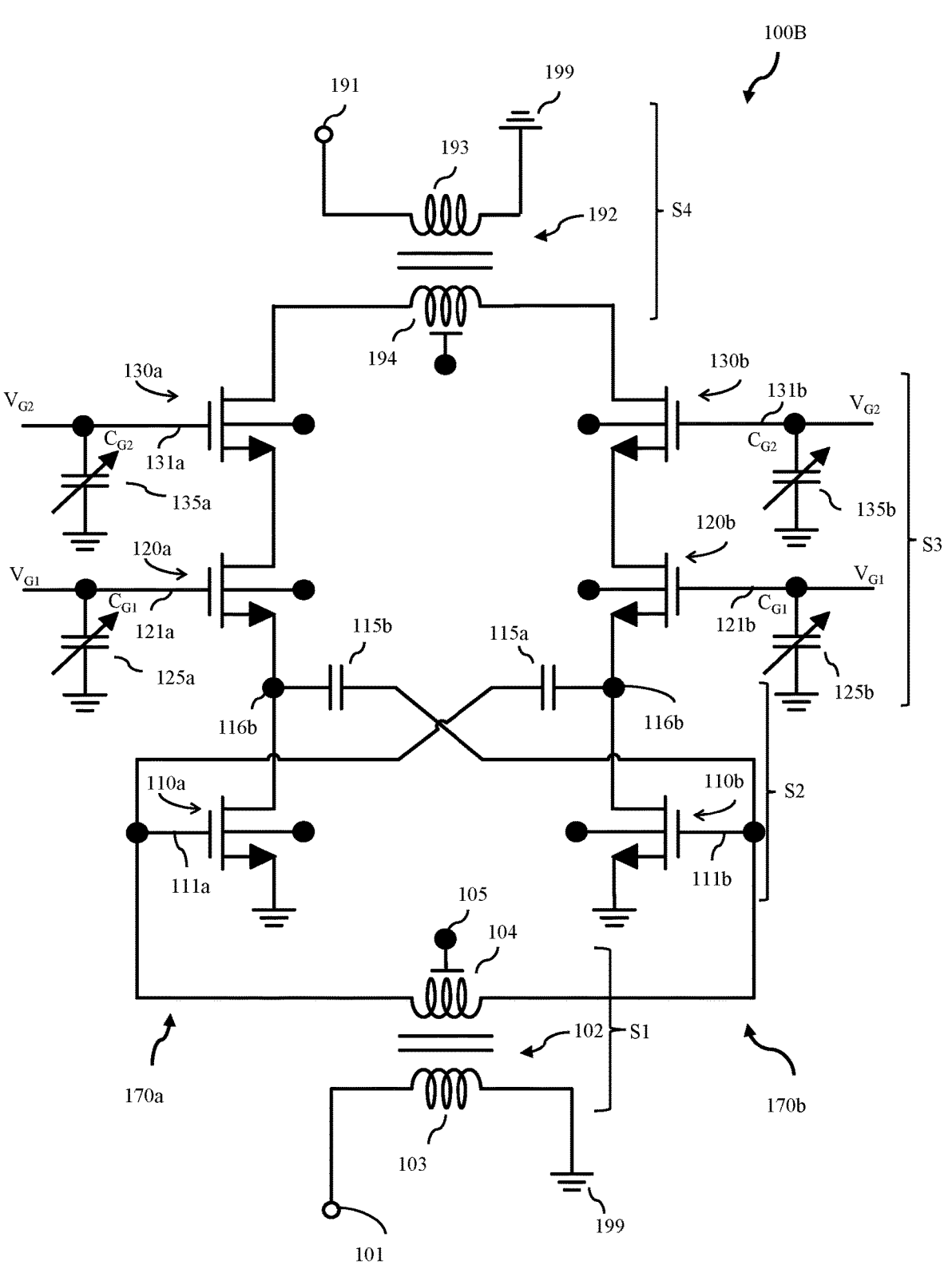
Figure 1C:
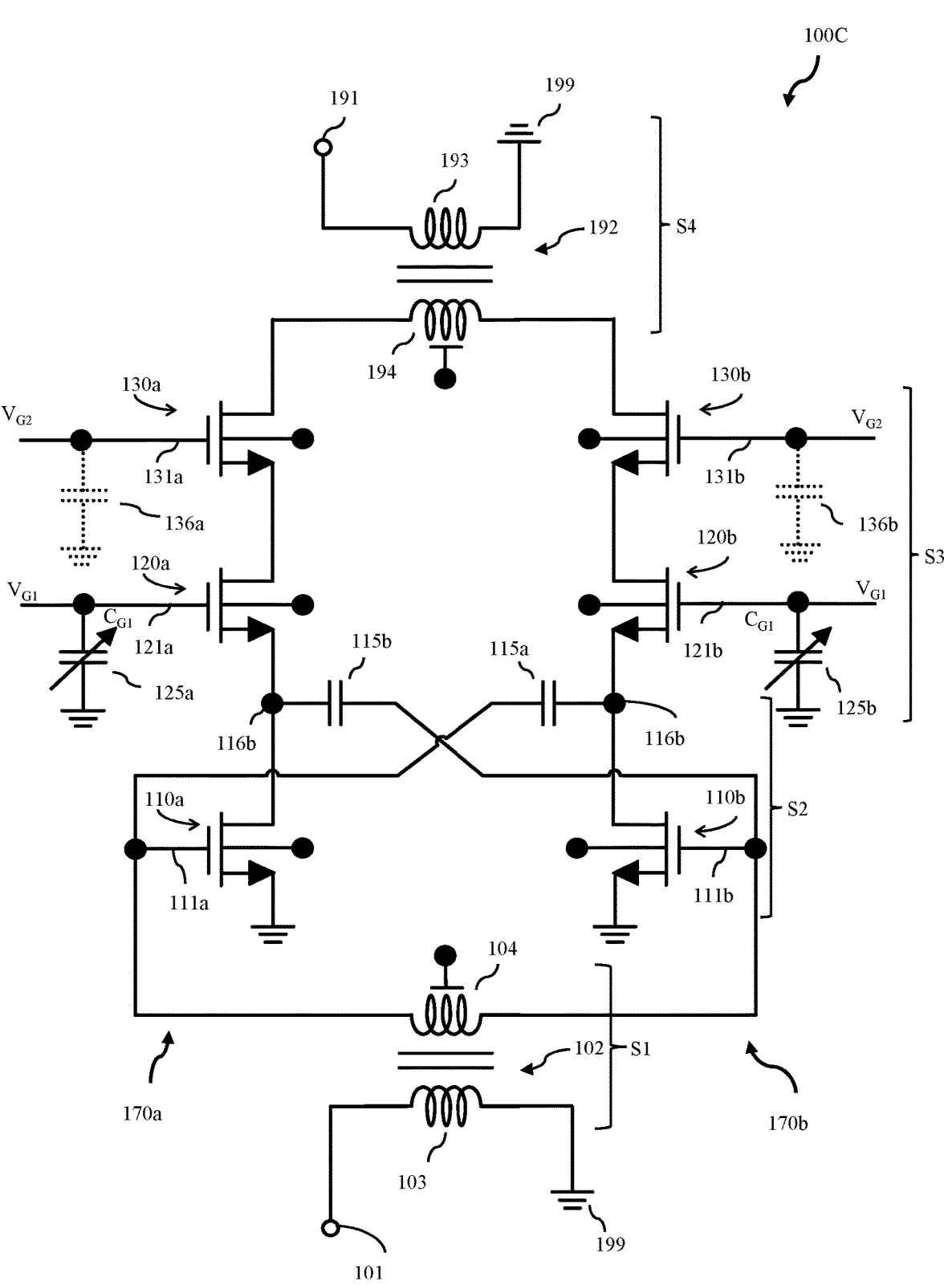
Figure 2A:
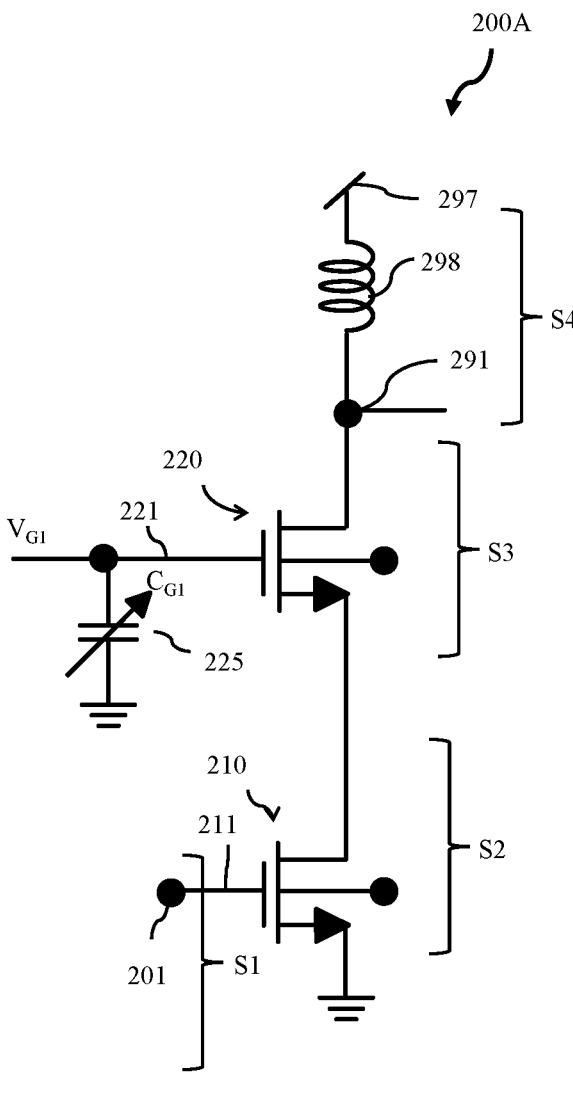

FIGS. 1A, 1B and 1C are schematic diagrams illustrating alternative embodiments of a differential amplifier circuit 100A, 100B and 100C, respectively, including a radio frequency (RF) input stage (S1), a drive stage (S2), a power stage (S3), and an RF output stage (S4) and, within the drive stage (S2) and the power stage (S3), two symmetric parallel branches 170a and 170b (also referred to herein as symmetric parallel branches), each connected at one end to the RF input stage (S1) and at the opposite end to the RF output stage (S4). FIGS. 2A, 2B, and 2C are schematic diagrams illustrating alternative embodiments of a single-ended amplifier circuit 200A, 200B, and 200C, respectively, including an RF input stage (S1), a drive stage (S2), a power stage (S3), and an RF output stage (S4) and, within the drive stage (S2) and the power stage (S3), a single leg connected between the RF input and output stages. It should be understood that the disclosed amplifier circuits and components thereof can specifically be configured to operate within the radio frequency (RF) band (i.e., 3 kHz to 300 GHz) and can, for example, be configured to operate within the millimeter wave (mmWave) band thereof (e.g., 30 GHz-300 GHz).

In each of these embodiments, RF input stage (S1) can be connected to receive an RF input signal at an input node 101, 201. Drive stage (S2) can be connected between RF input stage (S1) and power stage (S3) and can regulate current flow through the circuit. Power stage (S3) can be connected between drive stage (S2) and RF output stage (S4) and can amplify the RF input signal, converting it from a lower power RF signal to a higher power RF signal (e.g., by increasing the large-signal voltage swing across transistors within the power stage (S3), as discussed in greater detail below). RF output stage S4 can be connected to power stage 110 can be configured to receive and output the higher power output signal (i.e., the RF output signal) at an output node 191, 291 as well as to provide impedance matching for the RF output signal at the output node 191, 291. As mentioned above, within the power stage (S3) of a differential amplifier circuit 100A-100C, the parallel branches can include one or more pairs of power transistors, gates of the power transistors in at least one of the pairs can be electrically connected to corresponding varactors, and the capacitances of the varactors can be selectively adjusted to for stability (e.g., to achieve a μ-stability factor>1) and/or to improve performance. Similarly, within the power stage (S3) of a single-ended amplifier circuit 200A-200C, the leg can include one or more power transistors, the gate of at least one power transistor can be electrically connected to a varactor, and the capacitance of the varactor(s) can be selectively adjusted for stability (e.g., to achieve a μ-stability factor>1) and/or to improve performance.

More particularly, referring to the differential amplifier circuit 100A-100C of FIGS. 1A-1C. This circuit 100A-100C can include an RF input stage (S1) and an output stage (S4). Parallel branches 170a and 170b can extend between the input stage (S1) and the output stage (S4) and can include a drive stage (S2) and a power stage (S3). Input stage (S1) can include an RF input node 101 for receiving an RF input signal. Input stage (S1) can further include, for example, an RF input transformer 102 to match the input impedance of the input stage to that of the preceding stage. Input transformer 102 can include two magnetically coupled input windings 103 and 104. Input winding 103 can have one terminal electrically connected to input node 101. The opposite terminal can be electrically connected to ground 199, as illustrated, such that the input transformer 102 is a balun (i.e., a balanced-to-unbalanced signal conversion-type transformer). However, those skilled in the art will recognize that, alternatively, the received input could instead be a differential input with opposite ends of the input winding 103 being connected to a positive input node and a negative input node, respectively. Input winding 104 can have opposite terminals electrically connected to the parallel branches 170a and 170b, respectively, in the drive stage (S2), as discussed in greater detail below. Alternatively, the input stage (S1) can have any other suitable configuration.

Output stage (S4) can include an RF output node 191. Output stage (S4) can further include, for example, an RF output transformer 192. Output transformer 192 can include two magnetically coupled output windings 193 and 194. The output winding 193 can have one terminal electrically connected to the output node 191 and the opposite terminal electrically connected to ground 199, as illustrated. However, those skilled in the art will recognize that, alternatively, the output could instead be a differential output with opposite ends of the output winding 193 being connected to a positive output node and a negative output node, respectively. The output winding 104 can have opposite terminals electrically connected to the parallel branches 170*a* and 170*b*, respectively, in the power stage (S3), as discussed in greater detail below. Alternatively, the output stage (S4) can have any other suitable configuration.

Drive stage (S2) can include transistors 110*a*, 110*b* (also referred to herein as input common source transistors) in the parallel branches 170*a*-170*b*. It should be noted that to distinguish the transistors 110*a* and 110*b* of the drive stage (S2) from transistors within other stages of the structure, these transistors 110*a*, 110*b* are referred to herein as drive transistors. The drive transistors 110*a*, 110*b* can, for example, be N-type field effect transistors (NFETs). Each drive transistor 110*a*, 110*b* has a gate 111*a*, 111*b* connected to the input stage (S1). Specifically, one terminal of the winding 104 is electrically connected to the gate 111*a* of the drive transistor 110*a* in the branch 170*a* and the opposite terminal of the winding 104 is electrically connected to the gate 111*b* of the drive transistor 110*b* in the branch 170*b*. Additionally, each drive transistor 110*a*, 110*b* can have a source/drain region (e.g., a source region in the case of NFET drive transistors) connected to ground.

Power stage (S3) can include one or more transistors in the parallel branches 170*a*-170*b* electrically connected in series with the drive transistors 110*a*, 110*b*, respectively. It should be noted that to distinguish the transistors of the power stage (S3) from transistors of other stages within the structure, the transistors of the power stage (S3) are referred to herein as power transistors. The power transistors, like the drive transistors, can be, for example, NFETs. More specifically, as illustrated in FIG. 1A, power stage (S3) of amplifier circuit 100A can include a pair of power transistors 120*a*-120*b* in the parallel branches 170*a*-170*b*. This pair of power transistors 120*a*-120*b* can be referred to as common-gate like power transistors, as they are connected to receive the same DC gate voltage ($V_{G1}$). Power transistor 120*a* can be electrically connected in series between the drive transistor 110*a* and one input terminal of the output winding 194, whereas power transistor 120*b* can be electrically connected in series between the drive transistor 110*b* and the opposite input terminal of the output winding 194. Alternatively, power stage (S3) can include multiple pairs of power transistors in the parallel branches 170*a*-170*b*. For example, as illustrated in FIG. 1B and FIG. 1C, power stage (S3) of amplifier circuit 100B, 100C can include a pair of first power transistors 120*a*-120*b* and a pair of second power transistors 130*a*-130*b* in the parallel branches 170*a*-170*b*. The first power transistors 120*a*-120*b* can be common-gate-like power transistors connected to receive the same first gate voltage ($V_{G1}$) and the second power transistors 130*a*-130*b* can similarly be common-gate-like power transistors connected to receive the same second gate voltage ($V_{G2}$), which is different from $V_{G1}$. In this case, the first power transistor 120*a* and the second power transistor 130*a* can be electrically connected in series between the drive transistor 110*a* and one terminal of the output winding 194, whereas the first power transistor 120*b* and the second power transistor 130*b* can be electrically connected in series between the drive transistor 110*b* and the opposite terminal of the output winding 194. Optionally, the differential amplifier circuit could further include additional pairs of power transistors (not shown).

As mentioned above, optionally, drive stage (S2) can include neutralization capacitors 115*a*, 115*b* cross-coupled with the drive transistors 110*a*, 110*b*. For example, the gate

111*a* of the drive transistor 110*a* in the parallel branch 170*a* (which is connected to one terminal of the input winding 104) can also be coupled by a neutralization capacitor 115*a* to a junction node 116*b* in the parallel branch 170*b* between the drive transistor 110*b* and the power transistor 120*b* and the gate 111*b* of the drive transistor 110*b* in the parallel branch 170*b* (which is also connected to the opposite terminal of the input winding 104) can be coupled by a neutralization capacitor 115*b* to a junction node 116*a* in the parallel branch 170*a* between the drive transistor 110*a* and the power transistor 120*a*. The neutralization capacitors 115*a*, 115*b* are used to cancel the parasitic gate-to-drain capacitance and improve the reverse isolation and power gain. Those skilled in the art will recognize that, while not mandatory for operation, the use of such neutralization capacitors is recommended in high frequency designs to generate increased power gain and to improve reverse isolation in the operation band (e.g., 76 GHz-81 GHz, for example, for automotive radar applications). As illustrated, the gates of the drive transistors 110*a*, 110*b* are specifically not electrically connected to varactors.

Power stage (S3) can further include at least one pair of varactors (also referred to herein as variable capacitors) for at least one of pair of power transistors. More specifically, as illustrated in FIG. 1A, in differential amplifier circuit 100A with a single pair of power transistors, power stage (S3) can include a pair of varactors 125*a*-125*b* electrically connected to the gates 121*a*-121*b*, respectively, of the pair of power transistors 120*a*-120*b* and further electrically connected to ground. As illustrated in FIG. 1B, in differential amplifier circuit 100B with multiple pairs of power transistors, power stage (S3) can include pairs of varactors 125*a*-125*b*, 135*a*-135*b* for each pair of power transistors 120*a*-120*b*, 130*a*-130*b*. Specifically, a pair of first varactors 125*a*-125*b* can be electrically connected to the gates 121*a*-121*b*, respectively, of the pair of first power transistors 120*a*-120*b* and further electrically connected to ground and a pair of second varactors 135*a*-135*b* can be electrically connected to the gates 131*a*-131*b*, respectively, of the pair of second power transistors 130*a*-130*b* and further electrically connected to ground. Alternatively, as illustrated in FIG. 1C, in some differential amplifier circuits with multiple pairs of power transistors, power stage (S3) can include at least one pair of varactors connected to at least one of the pairs of power transistors and another pair of power transistors can be either disconnected from any capacitors or connected to a fixed capacitor. For example, a pair of varactors 125*a*-125*b* can be electrically connected to the gates 121*a*-121*b*, respectively, of the pair of first power transistors 120*a*-120*b* and further electrically connected to ground. Optionally, a pair of fixed capacitors 136*a*-136*b* can be electrically connected to the gates 131*a*-131*b*, respectively, of the pair of second power transistors 130*a*-130*b* and further electrically connected to ground or, alternatively, the gates 131*a*-131*b* can be disconnected from any capacitors.

Referring to the single-ended amplifier circuit 200A-200C of FIGS. 2A-2C. This circuit 200A-200C can include an RF input stage (S1) and an output stage (S4) and a single leg that extends between the input stage (S1) and the output stage (S4) and includes a drive stage (S2) and a power stage (S3).

Input stage (S1) can include an RF input node 201 for receiving an RF input signal. The RF input node 201 can be electrically connected to the drive stage (S2), as discussed below.

Output stage (S4) can include an RF output node 291. Output stage (S4) can further include, for example, an inductor 298 with opposite terminals connected to a voltage rail 297 (e.g., a positive supply voltage (VDD) rail) and to the output node 291.

Drive stage (S2) can include a transistor 210. It should be noted that to distinguish the transistor 210 of the drive stage (S2) from transistor(s) of other stages in the structure, transistor 210 is referred to herein as a drive transistor. The drive transistor 210 can, for example, be an NFET and can have a gate 211 electrically connected to the input node 201. Additionally, drive transistor 210 can have a source/drain region (e.g., a source region in the case of an NFET drive transistor) connected to ground.

Power stage (S3) can include one or more transistors connected in series with the drive transistors 210. It should be noted that to distinguish the transistor(s) of the power stage (S3) from transistor(s) within other stages of the structure, the transistor(s) in the power stage (S3) are referred to herein as power transistor(s). The power transistor(s) can be, for example, NFETs. More specifically, as illustrated in FIG. 2A, power stage (S3) of amplifier circuit 200A can include a power transistor 220. Power transistor 220 can be electrically connected in series between the drive transistor 210 and the output node 291. Alternatively, power stage (S3) can include multiple power transistors. For example, as illustrated in FIG. 2B and FIG. 2C, power stage (S3) of amplifier circuit 200B, 200C can include a first power transistor 220 and a second power transistor 230 electrically connected in series between the drive transistor 210 and the output node 291. Optionally, the single-ended amplifier circuit could also include additional power transistors (not shown)

Power stage (S3) can further include at least one varactor (also referred to herein as a variable capacitor) for at least one power transistor. More specifically, as illustrated in FIG. 2A, in single-ended amplifier circuit 200A with a single power transistor 220, power stage (S3) can include a single varactor 225 electrically connected to the gate 221 of the power transistor 220 and further electrically connected to ground. As illustrated in FIG. 2B, in single-ended amplifier circuit 200B with multiple power transistors, power stage (S3) can include varactors 225, 235 for power transistors 220, 230. Specifically, a first varactor 225 can be electrically connected to the gate 221 of the first power transistor 220 and further electrically connected to ground and a second varactor 235 can be electrically connected to the gate 231 of the second power transistor 230 and further electrically connected to ground. Alternatively, as illustrated in FIG. 2C, in some single-ended amplifier circuits 200C with multiple power transistors, power stage (S3) can include at least one varactor connected to at least one power transistor and another power transistor can be either disconnected from any capacitors or connected to a fixed capacitor. For example, varactor 225 can be electrically connected to the gate 221 of the first power transistor 220 and further electrically connected to ground. Optionally, a fixed capacitor 236 can be electrically connected to the gate 231 of the second power transistor 230 and further electrically connected to ground or, alternatively, the gate 231 of power transistor 230 could be disconnected from any such capacitors.

Figure 3:
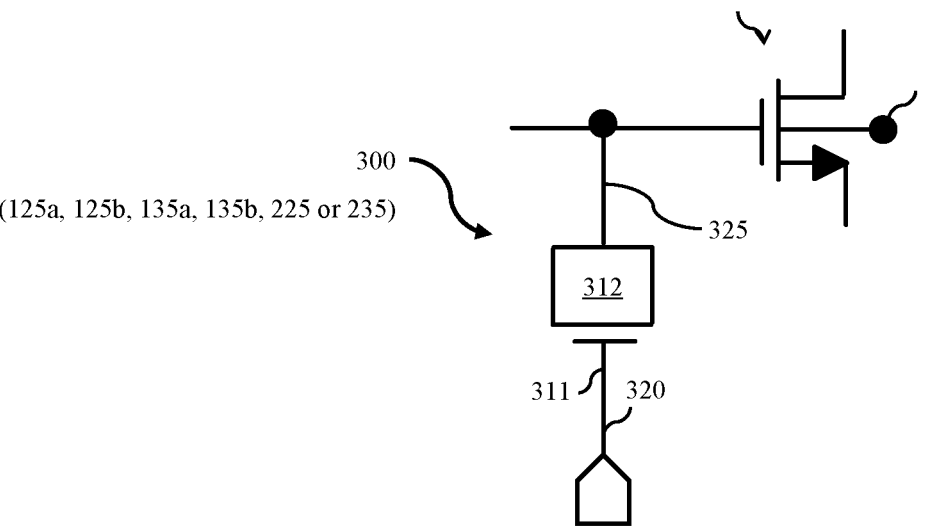
FIG. 3 is a schematic diagram illustrating a varactor that can be incorporated into any of the disclosed amplifier circuit embodiments.

Referring to FIG. 3, the capacitance of each of the above-referenced varactors can be selectively controlled by a variable capacitance control voltage 320 (e.g., a reverse bias voltage). The variable capacitance control voltage 320 can be a variable DC voltage received by a varactor from, for example, from any suitable on-chip variable voltage generation circuit, such as a bias voltage generation circuit, a serial peripheral interface (SPI)-controlled power supply, a dedicated variable voltage source, or any other suitable type of on-chip variable voltage generation circuit. The above-described varactors can be metal oxide semiconductor (MOS) varactors, such as the MOS varactor 300 illustrated in FIG. 3. Such a MOS varactor 300 can include a semiconductor body 312 (e.g., monocrystalline semiconductor body) and a gate 311 adjacent to a surface of the semiconductor body 312. The gate 311 can include, for example, a gate dielectric layer adjacent to the semiconductor body and a gate conductor layer on the gate dielectric layer. The gate dielectric layer can be, for example, a silicon dioxide layer or a gate dielectric layer including one or more layers of any other suitable gate dielectric material (e.g., a high-K gate dielectric layer). The gate conductor layer can be, for example, a doped polysilicon layer, a metal or metal alloy layer, or a gate conductor layer including one or more layers of any other suitable gate dielectric material. The semiconductor body 312 can be electrically connected to the gate of a corresponding power transistor. The gate 311 can be electrically connected to receive the variable capacitance control voltage 320 (as discussed above) for reverse biasing the MOS varactor 300 to either increase or decrease the capacitance thereof and thereby increase or decrease the gate capacitance ($C_G$) of the power transistor to which the varactor is electrically connected. In some embodiments, such a MOS varactor 300 can be implemented using a silicon-on-insulator (SOI) N-type field effect transistor (NFET) in an N-well capacitor (also referred to herein as an SOI MOS varactor).

It should be noted that in differential amplifier circuits 100A-100C of FIGS. 1A-1C, each pair of varactors will be receive the same capacitance control voltage to ensure that the pair of power transistors connected thereto have the same gate capacitances and symmetry is preserved. That is, the pair of varactors 125*a*-125*b* will receive the same capacitance control voltage (e.g., the same reverse bias voltage) so that the pair of power transistors 120*a*-120*b* have the same gate capacitances ($C_{G1}$) and, if applicable (e.g., see FIG. 1B), the pair of second varactors 135*a*-135*b* will receive the same second capacitance control voltage (e.g., the same second reverse bias voltage) so that the pair of second power transistors 130*a*-130*b* have the same second gate capacitances ($C_{G2}$), which is the same as or different than $C_{G1}$. In the single-ended amplifier circuits 200A-200C of FIGS. 2A-2B, the varactor 225 will receive a capacitance control voltage (e.g., a reverse bias voltage) to set the gate capacitance ($C_{G1}$) of the power transistor 220 and, if applicable (e.g., see FIG. 2B), the second varactor 235 will receive a second capacitance control voltage (e.g., a second reverse bias voltage) so the second power transistor 230 has a second gate capacitance ($C_{G2}$) that is either the same as or different from $C_{G1}$.

Figure 4:
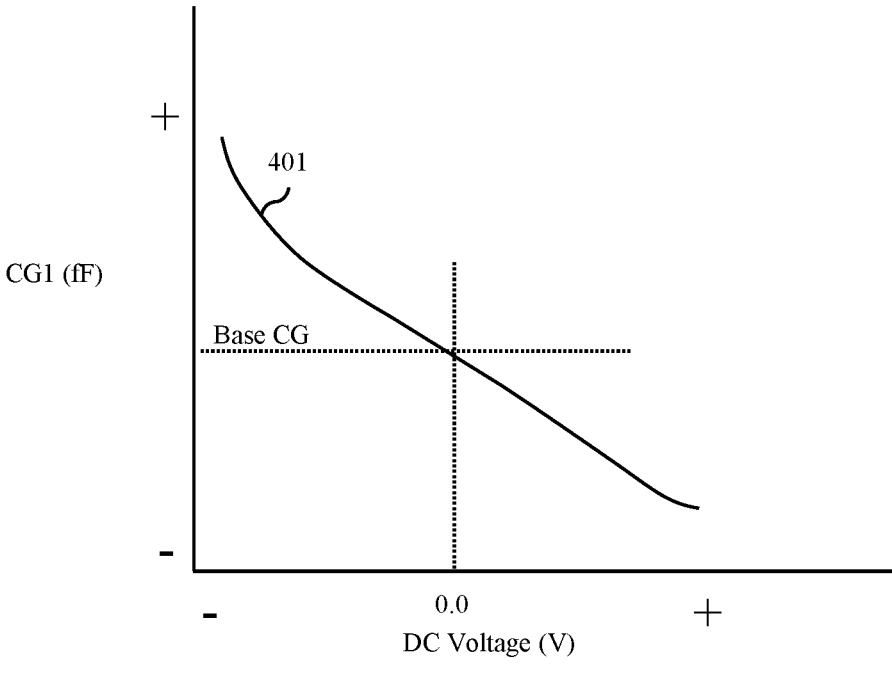
FIG. 4 is a graph illustrating an example of a relationship between changes in the capacitance control voltage applied to a varactor to changes in the gate capacitance of a power transistor connected to the varactor.

FIG. 4 is a graph illustrating a possible relationship between power transistor gate capacitance and varactor reverse bias voltage in, for example, an amplifier circuit, such as the amplifier circuit 100A of FIG. 1A with all NFET transistors and operating at nominal frequency within a given operating band (e.g., 78.56 GHz in an operating band of approximately 76 GHz to 81 GHz, for example, for automotive radar applications). Specifically, the curve 401 illustrates the relationship between changes in the DC voltage (i.e., reverse bias voltage) applied to each varactor of the pair of varactors 125*a*-125*b* to changes in the gate capacitance ($C_{G1}$) of each power transistor of the pair of power transistors 120*a*-120*b*. As illustrated, the power transistors 120*a*-120*b* each have a base level gate capacitance (e.g., of approximately X femtofarads (fF)) when there is essentially no reverse biasing of varactors 125a-125b (i.e., when the variable capacitance control voltage 320 applied to the gates of the varactors 125a-125b is approximately 0.0V, plus or minus up to 5.0 mV). Additionally, as illustrated, increasing the reverse bias voltage (i.e., making it more positive) reduces $C_{G1}$ and decreasing the reverse bias voltage (i.e., making it more negative) increases $C_{G1}$.

For purposes of illustration, the amplifier circuits 100A-100C of FIGS. 1A-1C and the amplifier circuits 200A-200C of FIGS. 2A-2C are described above and illustrated in the figures as including all NFETs. Alternatively, such amplifier circuits could include all PFETs or a combination thereof. However, it should be understood that reverse bias conditions applied to varactors connected to the gates of PFET power transistors to increase or decrease power transistor gate capacitance will be different from the reverse bias conditions applied to varactors connected to gates of NFET power transistors to increase or decrease power transistor gate capacitance.

Also disclosed herein are method embodiments for operating the above-described amplifier circuits 100A-100C of FIGS. 1A-1C and 200A-200C of FIGS. 2A-2C. Specifically, in each of the above-described amplifier circuits 100A-100C of FIGS. 1A-1C or amplifier circuits 200A-200C, capacitance of the varactor(s) can be adjusted (e.g., up or down) in order to fine-tune power transistor gate capacitance and thereby achieve stability and/or improve performance.

Amplifier circuit performance can, for example, be measured in terms Pout or PAE. Stability can be characterized, for example, using any suitable stability factor. For purposes of illustration, the operating methods are described below using the μ-stability factor to characterize stability. However, it should be understood that any other suitable stability factor could be employed (e.g., the k-stability factor). In any case, those skilled in the art will recognize that an amplifier circuit with a μ-stability factor<1 is considered unstable, whereas an amplifier circuit with a μ-stability factor>1 is considered stable (i.e., immune from spurious oscillations). Thus, for example, if amplifier circuit operation is outside some predetermined set of PVT conditions (e.g., at a ff process corner, at a temperature outside the normal operating temperature range, at a $I_{DC}$ outside the normal operating $I_{DC}$ range, etc.) and, as a result, the amplifier circuit is deemed to be unstable (i.e., a μ-stability factor<1), the power transistor gate capacitance(s) can be fine-tuned via the varactor(s) to achieve stability through setting appropriate impedance at junction nodes 116a, 116b (i.e., a μ-stability factor>1). Optionally, power transistor gate capacitance adjustment can also be performance dependent. Alternatively, even if amplifier circuit operation is within the predetermined set of PVT conditions (e.g., at a tt process corner, within the normal temperature range, at an optimal $I_{DC}$, etc.) such that the amplifier circuit is deemed to be stable, gate capacitance(s) of the power transistor(s) can be fine-tuned via the varactor(s) to improve post-silicon performance.

More specifically, those skilled in the art will recognize that PVT variations can cause changes in the electrical properties of the various components (e.g., devices, operating points, etc.) within an amplifier circuit. Exemplary PVT-dependent electrical properties that impact performance and/or stability include, but are not limited to, transistor's threshold voltage (Vt), transconductance ($g_m$), parasitic capacitances, on-resistances, etc. These PVT-dependent electrical properties can, in turn, cause a change in the optimum impedance(s) needed at intermediate node(s) with the amplifier circuit to meet performance specifications and/or achieve stability.

For example, in the amplifier circuit 100A-100C of FIGS. 1A-1C, PVT-dependent changes in electrical properties of devices and/or interconnects therein can result in a change in an optimum drain impedance ($Z_{d,1}$) at intermediate nodes between drive transistors 110a-110b and power transistors 120a-120b, respectively, and, if applicable (e.g., see FIGS. 1B-1C), an optimum drain impedance ($Z_{d,2}$) at intermediate nodes between first power transistors 120a-120b and second power transistors 120a-120b. Similarly, the amplifier circuit 200A-200C of FIGS. 2A-2C, PVT-dependent changes in electrical properties of devices and/or interconnects therein can result in a change in an optimum drain impedance ($Z_{d,1}$) at an intermediate node between drive transistor 210 and power transistor 220 and, if applicable (e.g., see FIGS. 2B-2C), an optimum drain impedance ($Z_{d,2}$) at an intermediate node between first power transistor 220 and second power transistor 230. The impedance values (e.g., $Z_{d,1}$ and, if applicable, $Z_{d,2}$) are dependent upon several variables including power transistor gate capacitance and varactor capacitance. For example, $$Z_{d,1} = \frac{C_{gs,cg} + C_{var} + C_{gd,cg}(1 + g_{m,cg}Z_{d,cg})}{g_{m,cg}^2(C_{gd,cg} + C_{var})} g_{m,cg} - \tag{1}$$

$$\frac{C_{gs,cg} + C_{var} + C_{gd,cg}(1 + g_{m,cg}Z_{d,cg})}{g_{m,cg}^2(C_{gd,cg} + C_{var})} sC_{gs,cg},$$

where $C_{gs,cg}$ is power transistor (S3) intrinsic gate-source parasitic capacitance, $C_{var}$ is varactor capacitance, $C_{gd,cg}$ is power transistor (S3) intrinsic gate-drain parasitic capacitance, $g_{m,cg}$ is power transistor (S3) transconductance, and $Z_{d,cg}$ is impedance seen at the drain of the power transistor (S3). Thus, the optimal varactor capacitance can be determined using the following equation:

$$C_{var} = \frac{C_{gs,cg} + C_{gd,cg}(1 + g_{m,cg}R_{opt})}{g_{m,cg}R_{opt} - 1}, \tag{2}$$

where $R_{opt}$ is the optimum load impedance. Techniques for calculating the μ-stability factor of an amplifier circuit are well known in the art. Thus, the details thereof have been omitted from this specification in order to allow the reader to focus on the salient aspects of the disclosed embodiments. However, generally, it should be understood that μ-stability factor can be simulated through scattering parameter (S-parameter) simulation using the following equation:

$$\mu = \frac{1 - |S_{11}|^2}{|S_{22} - \Delta S_{11}^*| + |S_{12}S_{21}|}, \tag{3}$$

where $S_{11}$ is the input reflection coefficient, $S_{12}$ is reverse isolation, $S_{21}$ is forward gain, $S_{22}$ is output reflection coefficient, and $\Delta$ is determinant of the S-parameter matrix.

Consider an amplifier circuit, such as the amplifier circuit 100A of FIG. 1A with all NFET transistors and operating at nominal frequency within a given operating band. The following examples illustrate how power transistor gate capacitance can be adjusted to achieve stability given certain non-optimal PVT conditions in which required varactor capacitance would differ from that of optimal conditions due to changes in the parameters of equation (2) above (e.g., non-optimal biasing conditions, temperature conditions, or process corners).

When operating at an optimal biasing condition (e.g., some number of mA predetermined to achieve, for example, high efficiency, maximum output power, etc.), the base level gate capacitance (e.g., some number of femtofarads (fF)) may be sufficient to achieve the desired performance specifications (see FIG. 5.1A) and a µ-stability factor>1 (see FIG. 5.1B). However, if the biasing condition is changed, for example, increased (e.g., by some percentage or amount, such as by ~35% or approximately 12 mA) but gate capacitance (e.g., of $CG_{nominal}$) stays the same the µ-stability factor may change to <1, leading to instability (see FIG. 5.2B) even if there is no significant change in performance (see FIG. 5.2A). In this case, the power transistor gate capacitance ($C_{G1}$) can be increased (e.g., by some percentage or by some amount, such as by ~17% or ~13.5 fF) by reducing the varactor reverse bias voltage (see FIG. 4) to ensure that the amplifier circuit remains stable with a µ-stability factor>1 (see FIG. 5.3B). An added benefit can be a boost in performance (e.g., higher PAE and Pout) (see FIG. 5.3A).

When operating at some temperatures (e.g., a high temperature, or a nominal room temperature), the base level gate capacitance (e.g., of $CG_{nominal}$) may be sufficient to achieve a µ-stability factor>1 (see FIG. 6.1). However, when operating at other temperatures (e.g., a low temperature), the base level gate capacitance may result in a µ-stability factor<1 due to increased power gain, leading to instability (see FIG. 6.1). In this case, the power transistor gate capacitance ($C_{G1}$) can be decreased (e.g., by some percentage or amount, such as by ~5% or ~4 fF) by increasing the varactor reverse bias voltage (see FIG. 4) to ensure that the amplifier circuit remains stable with a µ-stability factor>1 at low operating temperatures as well as at high operating temperatures (see FIG. 6.2).

When operating at some process corners (e.g., ss or tt), the base level gate capacitance may be sufficient to achieve a µ-stability factor>1 (see FIG. 7.1). However, when operating at other process corners (e.g., ff), the base level gate capacitance may result in a µ-stability factor<1, leading to instability (see FIG. 7.1). In this case, the power transistor gate capacitance ($C_{G1}$) can be decreased (e.g., by some percentage or amount, such as by ~30% or by 24.5 fF) by increasing the varactor reverse bias voltage (see FIG. 4) to adjust inter-stack node impedance and ensure that the amplifier circuit remains stable with a µ-stability factor>1 at the ff process corner as well as at the other process corners (see FIG. 7.2).

The above-examples illustrate gate capacitance adjustment above or below the base level gate capacitance to achieve stability when PVT conditions would otherwise result in instability. Alternatively, such adjustments could be made simply to improve performance. For example, again consider an amplifier circuit, such as the amplifier circuit 100A of FIG. 1A with all NFET transistors and operating at nominal frequency within a given operating band. When operating at some optimal biasing condition, the base level gate capacitance may not be sufficient to achieve desired performance specifications (see FIG. 8.1A) even when the amplifier circuit is stable with a µ-stability factor>1 (see FIG. 8.1B) (e.g., due to added parasitics after chip fabrication). In this case, the power transistor gate capacitance ($C_{G1}$) can be adjusted in one direction or the other by adjusting the varactor reverse bias voltage (see FIG. 4) to tune and, particularly, to boost performance (e.g., higher PAE and Pout) (see FIG. 8.2A) without causing the amplifier circuit to become unstable (see FIG. 8.2B).

It should be noted that, in the examples above, the changes to the reverse bias voltage (i.e., the variable capacitance control voltage) applied to the varactors, the corresponding changes to the gate capacitance (e.g., increases or decreases, percentages or amounts), and the resulting changes in stability and/or performance are provided for illustration purposes and are not intended to be limiting. The relationship between these changes will depend, for example, on the design (i.e., the amplifier circuit operating frequency and amplifier circuit specifications including the specifications of the components therein including, but not limited to, the transistors, the varactors, etc.), the PVT conditions, and the technology node and can be readily determined through simulation.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit including:
an input stage;
an output stage; and
two parallel branches connected between the input stage and the output stage, wherein each branch includes:
a drive transistor and a power transistor connected in series to the output stage, wherein a gate of the drive transistor is connected to the input stage; and
a varactor connected to a gate of the power transistor and to ground.

2. The circuit of claim 1, wherein the varactor is controlled by a variable capacitance control voltage.

3. The circuit of claim 2, wherein the variable capacitance control voltage is adjustable to tune a stability factor.

4. The circuit of claim 2, wherein the variable capacitance control voltage is adjustable to tune performance.

5. The circuit of claim 2, wherein the varactor is a metal oxide semiconductor varactor.

6. The circuit of claim 1, wherein the input stage includes:
an input node; and
an input transformer including two magnetically coupled input windings, wherein one of the input windings is connected between the input node and any of ground and another input node, and wherein another of the input windings is connected at opposite ends to gates of drive transistors in the two parallel branches, respectively.

7. The circuit of claim 1, further comprising two neutralization capacitors, wherein each neutralization capacitor is connected to the gate of the drive transistor in one of the two parallel branches and to a junction between the drive transistor and the power transistor in another of the two parallel branches.

8. The circuit of claim 1, wherein the output stage includes:
an output node; and
an output transformer including two magnetically coupled output windings, wherein one of the output windings is connected between power transistors in the two parallel branches, respectively, and another of the output windings is connected between the output node and any of ground and another output node.

9. A circuit including:
an input stage;
an output stage; and
two parallel branches connected between the input stage and the output stage, wherein each branch includes:
a drive transistor, a first power transistor, and a second power transistor connected in series to the output stage, wherein a gate of the drive transistor is connected to the input stage;
a first varactor, wherein a gate of the first power transistor is connected to the first varactor; and
a second varactor, wherein a gate of the second power transistor is connected to the second varactor.

10. The circuit of claim 9, wherein a first variable capacitance of the first varactor is controlled by a first variable capacitance control voltage and wherein a second variable capacitance of the second varactor is controlled by a second variable capacitance control voltage.

11. The circuit of claim 10, wherein the first variable capacitance control voltage and the second variable capacitance control voltage are adjustable to tune a stability factor.

12. The circuit of claim 10, wherein the first variable capacitance control voltage and the second variable capacitance control voltage are adjustable to tune performance.

13. The circuit of claim 10, wherein the first varactor and the second varactor are metal oxide semiconductor varactors.

14. The circuit of claim 9, wherein the input stage includes:
an input node; and
an input transformer including two magnetically coupled input windings, wherein one of the input windings is connected between the input node and any of ground and another input node and wherein another of the input windings is connected at opposite ends to gates of drive transistors in the two parallel branches, respectively.

15. The circuit of claim 9, further including two neutralization capacitors, wherein each neutralization capacitor is connected to the gate of the drive transistor in one of the two parallel branches and to a junction between the drive transistor and the first power transistor in another of the two parallel branches.

16. The circuit of claim 9, wherein the output stage includes:
an output node; and
an output transformer including two magnetically coupled output windings, wherein one of the output windings is connected between second power transistors in the two parallel branches, respectively, and another of the output windings is connected between the output node and any of ground and another output node.

17. A circuit including:
an input stage;
an output stage;
a drive transistor and a power transistor connected in series to the output stage, wherein a gate of the drive transistor is connected to the input stage; and
a varactor connected to a gate of the power transistor and to ground.

18. The circuit of claim 17, wherein a variable capacitance of the varactor is controlled by a variable capacitance control voltage and wherein the variable capacitance control voltage is adjustable to tune any of a stability factor and performance.

19. The circuit of claim 17,
wherein the input stage includes an input node connected to the gate of the drive transistor, and
wherein the output stage includes:
an inductor connected to the power transistor and a voltage rail; and
an output node at a junction between the power transistor and the inductor.

20. The circuit of claim 17, further comprising:
a second power transistor, wherein the drive transistor, the power transistor, and the second power transistor are connected in series to the output stage; and
a second varactor, wherein a gate of the second power transistor is connected to the second varactor,
wherein the input stage includes an input node connected to the gate of the drive transistor, and
wherein the output stage includes:
an inductor connected to the second power transistor and a voltage rail; and
an output node at a junction between the second power transistor and the inductor.

* * * * *